United States Patent [19]

Sakurai

[11] Patent Number: 5,221,850
[45] Date of Patent: Jun. 22, 1993

[54] CONDUCTIVITY-MODULATING MOSFET

[75] Inventor: Kenya Sakurai, Kawawaki, Japan

[73] Assignee: Fuji Electric Co., Ltd., Kanagawa, Japan

[21] Appl. No.: 819,793

[22] Filed: Jan. 13, 1992

[30] Foreign Application Priority Data

Mar. 20, 1991 [JP] Japan ................................ 3-55202

[51] Int. Cl.⁵ ........................ H01L 29/06; H01L 29/78
[52] U.S. Cl. .................................... 257/173; 257/139; 257/147; 257/168
[58] Field of Search ...................... 357/23.13, 23.4; 257/138, 139, 147, 168, 173

[56] References Cited

U.S. PATENT DOCUMENTS

| 4,023,691 | 6/1981 | Hagino | 357/43 |
| 4,831,424 | 5/1989 | Yoshida et al. | 367/27.13 |
| 4,916,085 | 4/1990 | Frisina | 437/44 |
| 4,990,975 | 2/1991 | Hagino | 357/23.13 |

FOREIGN PATENT DOCUMENTS

| 59-149056 | 8/1984 | Japan | 357/23.4 |
| 69-177675 | 9/1985 | Japan | 357/23.4 |
| 61-216363 | 9/1986 | Japan | 357/23.4 |
| 1-215067 | 8/1989 | Japan | 357/23.4 |
| 2-5482 | 1/1990 | Japan | 357/23.4 |

Primary Examiner—Andrew J. James
Assistant Examiner—Stephen D. Meier
Attorney, Agent, or Firm—Kanesaka and Takeuchi

[57] ABSTRACT

When bypassing a high voltage surge by externally installing a diode between a collector and a gate and protecting a circuit by turning on an IGBT, it is difficult to select a withstand voltage of the diode, because the withstand voltage of the IGBT must be higher with a certain margin. In the present invention, regions of an inverse conductivity type are formed in a high resistivity layer of an IGBT as in base region, and a transistor is formed together with a collector layer of an inverse conductivity type, which is connected between the collectors of an IGBT to be utilized as a clamping transistor. The breakdown voltage of this transistor is made lower than the breakdown voltage of a bipolar transistor of the IGBT main body. Then when the transistor breaks down, the gate-emitter capacity of the IGBT is charged and the IGBT is turned on, thus absorbing the high energy produced by an abnormal voltage into the chip and increasing the withstand capacity.

6 Claims, 4 Drawing Sheets

— 5,221,850 —

CONDUCTIVITY-MODULATING MOSFET

BACKGROUND OF THE INVENTION AND RELATED ART STATEMENT

The present invention relates to a conductivity modulating MOSFET, wherein base current of bipolar junction transistors (BJT) is supplied by channel current of the MOSFET.

The conductivity-modulating MOSFET of the invention is also called an insulated gate-bipolar transistor (hereinafter abbreviated as IGBT). In the present power electronics field, the most attracted power devices are power MOSFET and the IGBT. The reason for this is that both provide high-speed switching performance and low-drive power consumption, which result in compactness and improved performance required by power electronics products. However, in the unlimited expansion of use and improved performance of power electronics products, the use of a larger current, higher voltage, and switching performance at a higher speed are required. In the BJT and IGBT module products used in inverter circuits for motor control, the module products with a withstand voltage of 1200 V and a current capacity of 400 to 800A have already been made available. The IGBT is by far superior to the BJT in terms of its high-speed switching performance. However, because of the high switching speed, in an inductance load generally used for switching a large power, IGBT generates an excessive spike voltage due to its large di/dt and when the voltage exceeds the breakdown voltage of a device, the device may be destroyed. Even if the voltage does not exceed the breakdown voltage, the electric field strength increased by the simultaneous application of high voltage and large current may exceed the breakdown field and generate avalanche multiplication, which results in destruction of a device. Particularly, under abnormal conditions, such as a load by short circuit, the power device is forcibly turned off in about 10 micro sec after an abnormal condition has been detected. At this time a very large short circuit current as well as a high withstand voltage are applied as shown in FIG. 2, and a further higher spike voltage is applied as shown by B because of di/dt by the turn-off of the device shown by A, which results in a breakdown or destruction due to the aforementioned mechanism.

In order to protect the device in the abnormal condition, it is very difficult to absorb energy in excess of the breakdown voltage in an IGBT of a high withstand voltage because of uneven electric field. Therefore, it is difficult to manufacture an IGBT with a high withstand voltage and a high avalanche withstand capacity with high yield and reliability.

Accordingly, it was proposed that as shown in FIG. 3, a high withstand voltage diode (32) with high avalanche withstand capacity of a withstand voltage $BV_R$, which is slightly lower than the breakdown voltage $BV_{CES}$ of an IGBT (31), and a low withstand voltage diode (33) with a withstand voltage of about 20 to 30 V, which is slightly higher than the voltage between the gate and the emitter in the IGBT (31), are externally attached between the gate and the collector. In case overvoltage is generated in an abnormal condition, it exceeds the breakdown voltage $BV_R$ of the diode (32), which is lower than the overvoltage $BV_{CES}$ of the IGBT (31). Therefore, the current flows to a gate electrode (34) of the IGBT to charge the gate-to-emitter capacity of the IGBT (31). When its threshold voltage is exceeded, the IGBT (31) turns on to absorb the overvoltage energy evenly into the chip. As a result, it can withstand the larger energy.

However, the method of connecting the diodes (32) and (33) by means of an external installation as shown in FIG. 3 causes the following drawbacks.

(a) Diodes with a withstand voltage slightly lower than that of the IGBT (31) must be selected individually, which is not practical.

(b) In case of an external installation, an inductance content is added thereto because of long wiring.

As a practical method for obviating the deficiency of (a), diodes which have withstand voltages considerably lower than the minimum withstand voltage of the IGBT are selected and connected. However, considering the wide range of the withstand voltage in the diodes, a withstand voltage which is significantly lower than that of the IGBT has to be admitted. This requires that the withstand voltage of the IGBT be shifted preliminarily to the high side. However, this choice aggravates the relation between the on-voltage of IGBT and the switching time.

For instance, assuming that the IGBT has a withstand voltage of 1,250 V, diodes having a withstand voltage within a range of 1,050 V to 1,200 V are used while considering the variance of the withstand voltage. In this case, unless the voltage applied to switching at every cycle is lower than a maximum of 1,050 V, there is a good chance of a breakdown as a result of increased switching loss. This in turn means that even the IGBT with a withstand voltage of 1,250 V can only guarantee a spike voltage of 1,050 V or less, which is 200 V lower than the withstand voltage.

Accordingly, an object of the present invention is to obviate the above problems and to provide an IGBT which allows the withstand voltage of each and every transistor to be set at an approximately definite value of 50 V or 100 V less than the withstand voltage of protection diodes without selection.

SUMMARY OF THE INVENTION

In order to achieve the above objects, the present invention uses an IGBT, in which a layer formed of second conductivity type is disposed on one side of a collector layer formed of first conductivity type, the layer of the second conductivity type including a high resistivity layer at least on a side away from the collector layer, and a base region formed of the first conductivity type is formed selectively in a surface layer of the high resistivity layer of the second conductivity type. Also, an emitter region formed of the second conductivity type is formed selectively in the surface layer of the base region. A portion sandwiched by the aforementioned high resistivity layer of the second conductivity type in the base region and the emitter region is used as a channel region, on which a gate electrode via an insulation film, an emitter electrode commonly contacting the base region and the emitter region, and a collector electrode contacting the collector layer are disposed respectively. In this IGBT, an annex region formed of the first conductivity type is selectively formed in the surface layer of the high resistivity layer of the second conductivity type to be separated from the base region. The width or thickness of the high resistivity layer formed of the second conductivity type on the collector layer side of the annex region is smaller than the width or thickness of the high resistivity layer formed of the second conductivity type on the collector layer side of the base region. A diode is disposed between an annex electrode contacting the annex region and the gate electrode such that a layer formed of the first conductivity type is positioned on the annex electrode side and a layer formed of the second conductivity type is positioned on the gate electrode side. Furthermore, the high resistivity layer formed of the second conductivity type may have a substantially even thickness, wherein the depth or thickness at the annex region is greater than that at the base region, or the annex region may have substantially the same depth or thickness as the base region, wherein a low resistivity layer formed of the second conductivity type is interposed between the high resistivity of the second conductivity type and the collector layer, and the depth or thickness of the low resistivity layer at a part facing the annex region is made thicker than that at a part facing the base region. In addition, it is effective that the diode connected between the annex electrode and the gate electrode is formed of semiconductor layers having a region made of the first conductivity type and a region made of the second conductivity type which are disposed via an insulation film on the surface where the base region of the high resistivity layer made of the second conductivity type and the annex region are arranged.

An equivalent circuit of the IGBT with a structure as described above takes a structure as shown in FIG. 4 in case the first conductivity type is a p-type, and the second conductivity type is an n-type. A main body of the IGBT has a p-n-p transistor (21) formed of a collector layer, a second conductivity type layer and a base region, an n-p-n transistor (22) formed of a second conductivity type layer, a base region and an emitter region, and a MOSFET (23) using the base region sandwiched between the emitter region and the second conductivity type layer as a channel region, and having a gate electrode thereupon via an insulation film. In the base region beneath the emitter region, there exists a base resistance $R_b$, and there is a capacity $C_{qE}$ between the gate and the emitter. The annex region formed by the present invention forms the p-n-p transistor (24) together with the second conductivity type layer and the collector layer, and between the collector and the gate, a diode (25) corresponding to the diode (33) in FIG. 3 is connected. The p-n-p transistor (24) and the p-n-p transistor (21) share a common base, and there is a resistance R' between them. The width or thickness of the high resistivity layer of the second conductivity type of the p-n-p transistor (24), that is the open base width, is narrower than the open base width of the p-n-p transistor (21) of the IGBT main body, so that it punches through or passes easily. In other words, it breaks down at a lower voltage.

For instance, when the IGBT turns off under a large current and a high voltage, a high di/dt is generated because of the high switching speed inherent to that IGBT, and further, the IGBT is exposed to a high spike voltage as a result of the inductance content. However, because the collector-to-emitter breakdown voltage $BV_{CEO}$ of the p-n-p transistor (24) is lower than $BV_{CEO}$ of the p-n-p transistor (21), the p-n-p transistor (24) breaks down first, and the breakdown current goes through the diode (25) and charges the gate-emitter capacity $C_{gE}$. When the voltage between the gate G and the emitter E finally reaches the threshold value of the MOSFET (23), the IGBT turns on. After it turns on, the current in the semiconductor element can be absorbed more evenly than in an avalanche breakdown condition, so that greater energy can be absorbed. In addition, when the inductance energy is absorbed while it is on, no more spike voltage is applied, and it is protected by a relatively low clamp voltage. These effects similarly occur in a p-channel IGBT, in which the conductivity type is reversed.

DETAILED DESCRIPTION OF PREFERRED EMBODIMENTS

Figure 1:
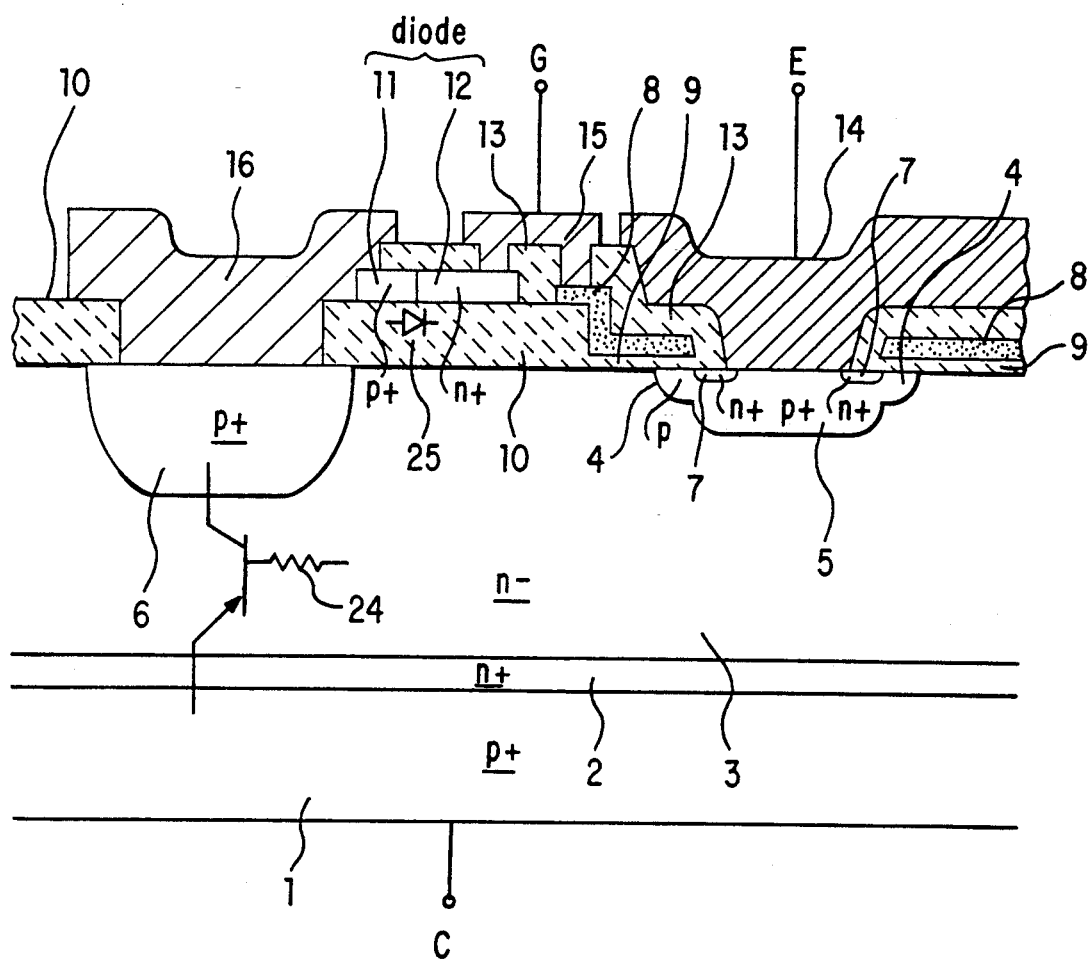
FIG. 1 is a cross-sectional view of an n-channel IGBT of one embodiment of the present invention.
Figure 2:
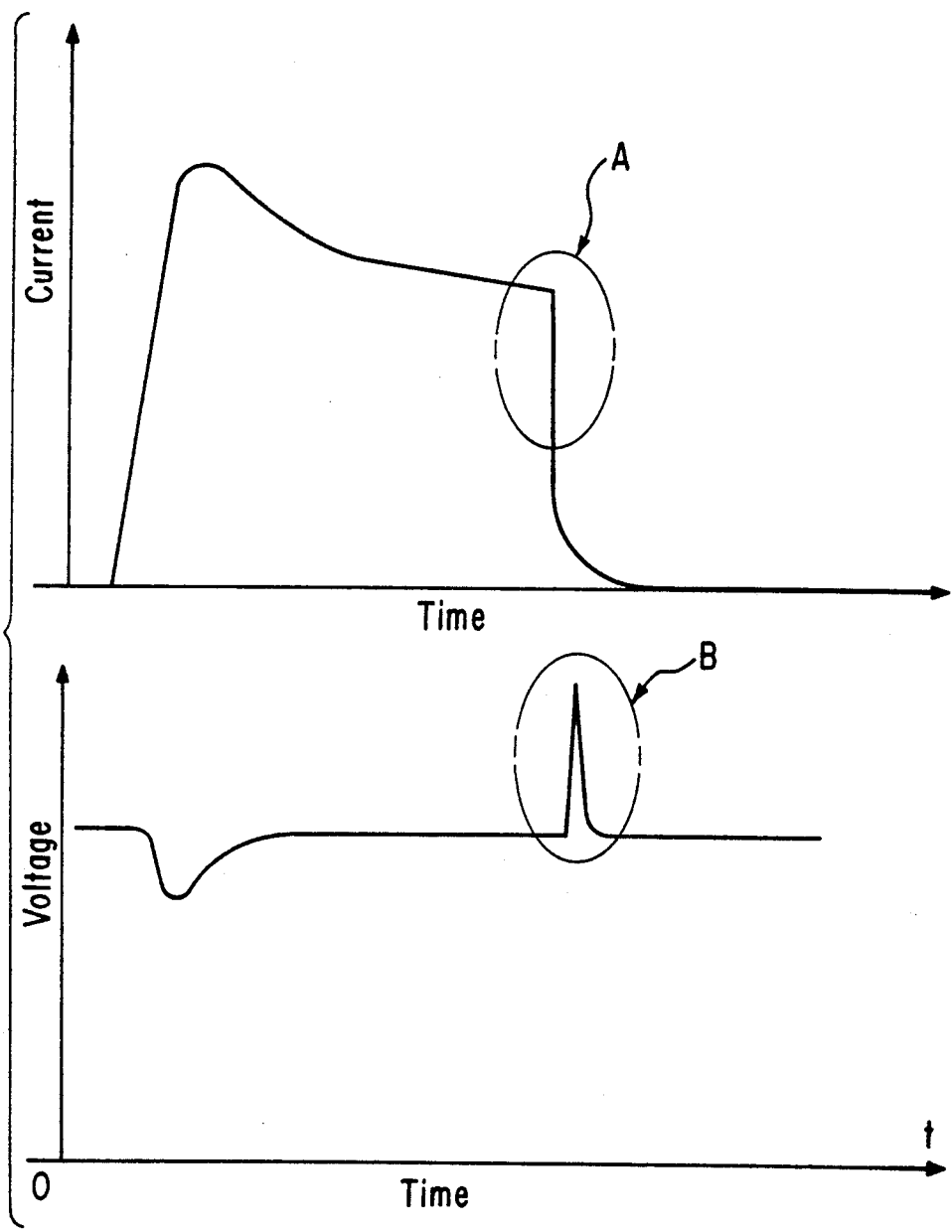
FIG. 2 is an equivalent circuit diagram of an IGBT disposed with the conventional protection means.
Figure 3:
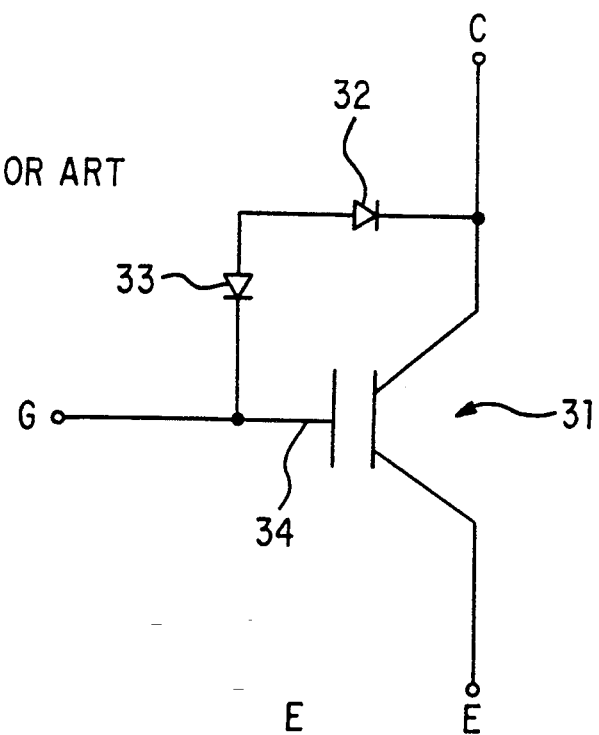
FIG. 3 is an current and voltage waveform chart for an IGBT at a load short circuit.

FIG. 1 shows an n-channel IGBT of one embodiment of the present invention. In the drawings, an n⁻ layer (3) is laminated on a p⁺ substrate (1) through an n⁺ buffer layer (2) to function as a collector layer, and in the surface layer of this n⁻ layer (3), p base regions (4) and a p⁺ base region (5) situated therebetween, and a p⁺ region (6) separated from these regions (4), (5) are selectively formed. The depth of the p⁺ region (6) is 12 micro meters, which is 4 micro meters deeper than the depth of the p⁺ base region (5) of 8 micro meters. In the surface layer of the p region 4 and the p⁺ region (5), n⁺ emitter regions (7) are formed selectively. Parts of the p region (4) sandwiched between the n⁺ region (7) and n⁻ layer (3) are channel regions, where gate electrodes (8) making this region an inversion layer are disposed via gate oxide films (9) made of polycrystal silicon. Furthermore, a polycrystal silicon layer is deposited on thick insulation films (10) following the gate oxide films (9), where a diode is formed by means of a p⁺ region (11) and an n⁺ region (12). On the surface of the n⁻ layer, formed are an emitter electrode (14), which is insulated from the gate electrode (8) by an insulation film (13) contacts both the p base regions (4) and the n⁺ source regions (7) and is connected to an emitter terminal E; a gate metal electrode (15), which contacts the gate electrode (8) and the n⁺ region (12) and is connected to a gate terminal G; and a connection electrode (16), which contacts the p⁺ region (6) and p⁺ region (11). Though not shown, a collector electrode contacts the surface of the p⁺ collector layer (1) and is connected to a collector terminal C.

Figure 4:
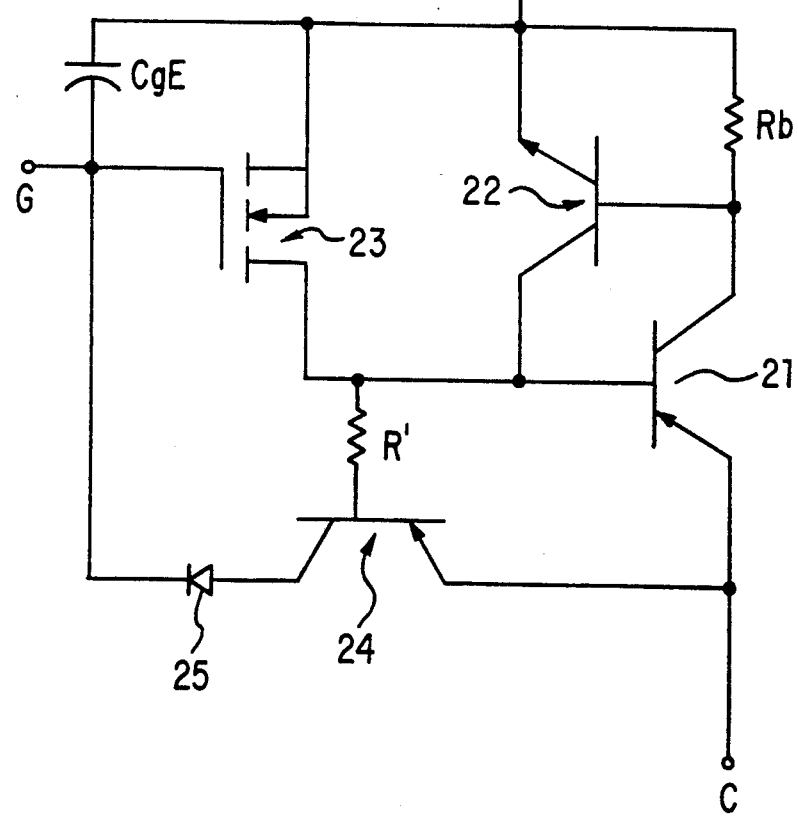
FIG. 4 is an equivalent circuit diagram of an IGBT according to the present invention.

In the structure shown in FIG. 1, a p-n-p transistor formed of the p⁺ layer (1), n⁺ layer (2), n⁻ layer (3) and p⁺ region (6) corresponds to a clamping transistor (24) in FIG. 4, and a diode formed of tho p⁺ region (11) and n⁺ region (12) corresponds to a diode (25) in FIG. 4. While the p-n-p transistor formed of the p⁺ layer (1), n⁺ layer (2) and n⁻ layer (3) and p⁺ base region (5) forms an active region of the IGBT, which corresponds to the transistor (21) in FIG. 4, wherein the collector-emitter breakdown voltage $BV_{CEO}$ of the p-n-p transistors (21), (24) can be controlled by the junction depth of its collector regions (5), (6). The resistivity and thickness may vary among the different silicon wafers, but the variance in one chip is extremely small. Therefore, the difference of $BV_{CEO}$ between the transistor (21) of the IGBT and the clamping transistor (24) can be easily manufactured at an approximately constant value such as 50 V or 100 V by controlling the depths or thickness of the p⁻ regions (4), (5).

Figure 5:
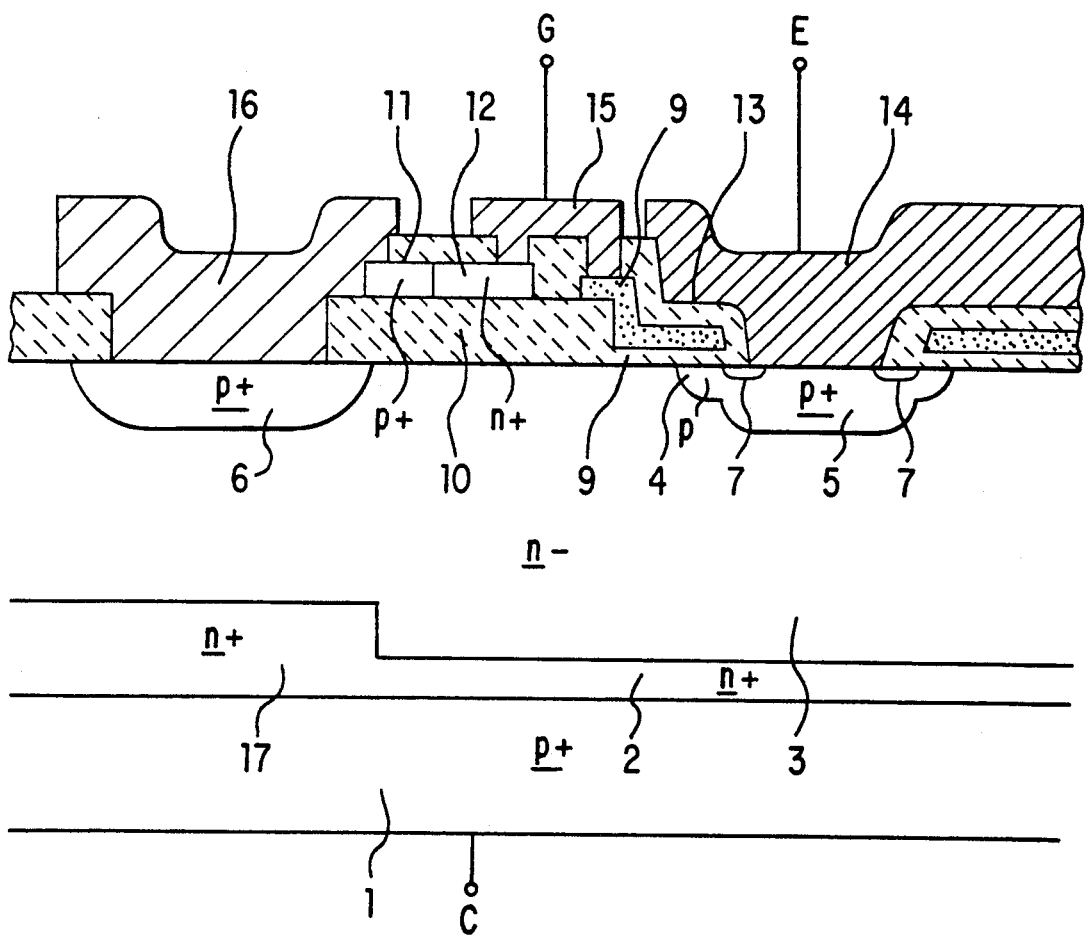
FIG. 5 is a cross-sectional view of an n-channel IGBT representing another embodiment of the present invention.

FIG. 5 shows an IGBT of another embodiment of the present invention, in which the parts common to those in FIG. 1 are given the same numerals. In this case, the p+ region (6) for the clamping transistor is formed simultaneously with the p+ base region (5) at the same depth or thickness, and an n+ layer (17) which is thicker than a buffer layer (2) is disposed beneath the p+ region (6). Thus, a depletion layer in an n⁻ layer (3) extending from the p+ region (6) can be punched through or pass to the n+ buffer layer (17), so that the $BV_{CEO}$ of the clamping p-n-p transistor (24) can be made lower than that of the p-n-p transistor (21) in the active region of the IGBT.

In the embodiments shown in FIGS. 1 and 5, the n+ buffer layer (2) is interposed between the p+ collector layer (1) and the n⁻ layer (3), but the present invention can be applied to an IGBT without a buffer layer. In that case, for the system shown in FIG. 5, only the n+ buffer layer (17) is formed. The present invention can even be applied to a p-channel IGBT by inverting the conductivity type of all the layers and regions.

According to the present invention, a clamping bipolar transistor is formed on one semiconductor element, wherein the abnormal voltage applied across a collector and a gate of an IGBT is bypassed, and the IGBT is turned on. The $BV_{CEO}$ of this clamping transistor can be decreased to the intended difference of the $BV_{CEO}$ of that particular transistor by forming an open base width narrower than the open base width of the bipolar transistor which is the active region of the IGBT. Therefore, the energy of the abnormal voltage greater than the $BV_{CEO}$ of the clamping transistor is absorbed when the IGBT is turned on, so that its turn-off withstand capacity is increased, and its reliability is improved. In addition, because the variance in the difference between the $BV_{CEO}$ of the clamping transistor and the $BV_{CEO}$ of the bipolar transistor of the IGBT main body can be reduced, the difference of the $BV_{CEO}$ need not be formed large, and even in a high-withstand voltage IGBT, neither much margin nor a high withstand voltage setting is necessary. This effect greatly improves the relation between the on-voltage of the particular IGBT and the switching speed. Furthermore, the diode connected in series with the clamping transistor can be greatly reduced in terms of the inductance content in the wiring by forming it on the semiconductor elements, when comparing with the external installation.

What is claimed is:

1. A conductivity-modulating MOSFET, comprising, a collector layer formed of first conductivity type, a high resistivity layer formed of second conductivity type and situated near the collector layer, a base region formed selectivley in a surface area of the high resistivity layer formed of the second conductivity type, said base region being formed of the first conductivity type and having a predetermined thickness, an emitter region formed selectively in a surface area of the base region, said emitter region being formed of the second conductivity type to thereby form a channel region at an area between the high resistivity layer formed of the second conductivity type near the base region and the emitter region, a gate electrode with an insulating film, said gate electrode being disposed on the channel region through the insulating film, an emitter electrode connected to both the base region and the emitter region, a collector electrode contacting the collector layer, an annex region formed of the first conductivity type, said annex region being selectively located in the surface area of the high resistivity layer formed of the second conductivity type and situated away from the base region, said annex region having an annex electrode and a predetermined thickness substantially the same as that of the base region, a low resistivity layer formed of the second conductivity type and interposed between the high resistivity layer and the collector layer, a thickness of the low resistivity layer at a portion facing the annex region being thicker than that at a portion facing the base region so that a thickness of the high resistivity layer under the annex region is thinner than a thickness of the high resistivity layer under the base region, and a diode formed between the annex electrode and the gate electrode, said diode having a layer formed of the first conductivity type at a side of the annex electrode and a layer formed of the second conductivity type at a side of the gate electrode, said diode being disposed on the surface of the high resistivity layer through an insulating film so that withstand voltage of the MOSFET can be easily set without fail.

2. A conductivity-modulating MOSFET, comprising, a collector layer formed of first conductivity type, a layer containing at least a high resistivity layer, said layer being formed of second conductivity type and situated near the collector layer such that the high resistivity layer is situated at a side opposite to the collector layer, said high resistivity layer having a substantially even thickness, a base region formed selectively in a surface area of the high resistivity layer formed of the second conductivity type, said base region being formed of the first conductivity type, an emitter region formed selectively in a surface area of the base region, said emitter region being formed of the second conductivity type to thereby form a channel region at an area between the high resistivity layer formed of the second conductivity type near the base region and the emitter region, a gate electrode with an insulating film, said gate electrode being disposed on the channel region through the insulating film, an emitter electrode connected to both the base region and the emitter region, a collector electrode contacting the collector layer, an annex region formed of the first conductivity type and selectively located in the surface area of the high resistivity layer formed of the second conductivity type, said annex region having an annex electrode and being situated away from the base region so that a depth of the annex region is greater than a depth of the base region, and a diode formed between the annex electrode and the gate electrode, said diode having a layer formed of the first conductivity type at a side of the annex electrode and a layer formed of the second conductivity type at a side of the gate electrode, said diode being disposed above the surface area of the high resistivity layer through an insulating film so that withstand voltage of the MOSFET can be easily set without fail.

3. A conductivity-modulating MOSFET as claimed in claim 2, wherein said layer further includes a low resistivity layer formed of the second conductivity type and interposed between the high resistivity layer and the collector layer.

4. A conductivity-modulating MOSFET as claimed in claim 3, wherein said low resistivity layer has substantially a constant thickness.

5. A conductivity-modulating MOSFET as claimed in claim 2, wherein a distance between the annex region and the collector layer is shorter than a distance between the base region and the collector layer.

6. A conductivity-modulating MOSFET as claimed in claim 2, wherein said gate electrode is not connected to the emitter electrode.

* * * * *